(12) United States Patent
Lee et al.

(10) Patent No.: US 10,145,024 B2
(45) Date of Patent: Dec. 4, 2018

(54) COOLING RATE CONTROL APPARATUS AND INGOT GROWING APPARATUS INCLUDING SAME

(71) Applicant: LG SILTRON INC., Gumi-si Gyeongsangbuk-do (KR)

(72) Inventors: Won-Ju Lee, Gumi-si (KR); Su-In Jeon, Gumi-si (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 23 days.

(21) Appl. No.: 14/771,632

(22) PCT Filed: Aug. 6, 2014

(86) PCT No.: PCT/KR2014/007278
§ 371 (c)(1),
(2) Date: Aug. 31, 2015

(87) PCT Pub. No.: WO2015/037831
PCT Pub. Date: Mar. 19, 2015

(65) Prior Publication Data
US 2016/0017514 A1     Jan. 21, 2016

(30) Foreign Application Priority Data
Sep. 11, 2013  (KR) .................. 10-2013-0109152

(51) Int. Cl.
C30B 15/20      (2006.01)
C30B 29/06      (2006.01)
C30B 15/14      (2006.01)

(52) U.S. Cl.
CPC ............ C30B 15/206 (2013.01); C30B 15/14 (2013.01); C30B 29/06 (2013.01); *Y10T 117/1032* (2015.01)

(58) Field of Classification Search
CPC ........ C30B 15/14; C30B 15/206; C30B 29/06
See application file for complete search history.

(56) References Cited

U.S. PATENT DOCUMENTS 5,248,378 A * 9/1993 Oda ...................... C30B 15/14
                                                        117/217
5,316,742 A * 5/1994 Tomioka ................ C30B 15/14
                                                        117/217
(Continued)

FOREIGN PATENT DOCUMENTS

DE       69937579 T2      9/2008
EP       1 275 755 A1     1/2003
(Continued)

OTHER PUBLICATIONS

Japanese Office Action dated Aug. 16, 2016 issued in Application No. 2015-561293.
(Continued)

*Primary Examiner* — Hua Qi
(74) *Attorney, Agent, or Firm* — Ked & Associates LLP (57) ABSTRACT

The present disclosure relates to an apparatus for growing an ingot from silicon melt contained in a crucible by using a seed crystal, the apparatus comprising a chamber including a lower portion for accommodating the crucible and an upper portion through which the growing ingot passes, and a cooling rate control unit which is disposed at the upper portion of the chamber to extend to the lower portion of the chamber and has a hole through which the growing ingot passes, wherein the cooling rate control unit comprises an insulation part for insulating the ingot, a cooling part disposed over the insulation part to cool the ingot, and a blocking part disposed between the insulation part and the cooling part to prevent heat exchange therebetween.

10 Claims, 6 Drawing Sheets

(56) References Cited

U.S. PATENT DOCUMENTS

| | | | | |
|---|---|---|---|---|
| 6,036,776 | A | * | 3/2000 | Kotooka ............... C30B 15/14 117/217 |
| 6,458,204 | B1 | * | 10/2002 | Okui ............... C30L 315/203 117/30 |
| 7,141,113 | B1 | | 11/2006 | Nakamura et al. |
| 2002/0134302 | A1 | * | 9/2002 | Ferry ............... C30B 15/14 117/213 |
| 2003/0089300 | A1 | * | 5/2003 | Hoshi ............... C30B 15/14 117/13 |
| 2003/0150373 | A1 | * | 8/2003 | Kubo ............... C30B 15/14 117/13 |
| 2008/0115720 | A1 | * | 5/2008 | Saishoji ............... C30B 15/14 117/217 |

FOREIGN PATENT DOCUMENTS

| | | | |
|---|---|---|---|
| JP | 63-319293 A | | 12/1988 |
| JP | H 0570283 | | 3/1993 |
| JP | 11-043393 A | | 2/1999 |
| JP | 11-043396 A | | 2/1999 |
| JP | 11-043396 A | | 2/1999 |
| JP | 11043396 A | * | 2/1999 |
| JP | 11043396 A | * | 2/1999 |
| JP | 2002-047094 | | 2/2002 |
| KR | 10-0331552 B1 | | 4/2002 |
| KR | 10-0847700 B1 | | 7/2008 |
| KR | 10-2010-0042466 A | | 4/2010 |
| KR | 2010-0085640 | | 7/2010 |
| KR | 10-1105950 B1 | | 1/2012 |
| KR | 10-2013-0079831 A | | 7/2013 |

OTHER PUBLICATIONS

Chinese Office Action issued in Application 201480013120.3 dated Mar. 20, 2017 (full Chinese text).

German Office Action issued in Application 11 2014 000 786.2 dated Nov. 16, 2017 (German text).

International Search Report issued in Application No. PCT/KR2014/007278 dated Nov. 27, 2014.

Korean Office Action issued in Application No. 10-2013-0109152 dated Mar. 26, 2015.

* cited by examiner

COOLING RATE CONTROL APPARATUS AND INGOT GROWING APPARATUS INCLUDING SAME

CROSS-REFERENCE TO RELATED PATENT APPLICATIONS

This application is a U.S. National Stage Application under 35 U.S.C. § 371 of PCT Application No. PCT/KR2014/007278, filed Aug. 6, 2014, which claims priority to Korean Patent Application No. 10-2013-0109152, filed Sep. 11, 2013, whose entire disclosures are hereby incorporated by reference.

TECHNICAL FIELD

The present disclosure relates to an ingot growing apparatus for producing ingots, and more particularly, to an ingot growing apparatus having a cooling unit to produce high quality ingots.

BACKGROUND ART

Silicon single crystal wafers which are used as a material of semiconductor devices are generally manufactured by a process slicing a single crystal ingot produced by a Czochralski (CZ) method.

A method for growing the silicon single crystal ingot by the Czochralski method includes melting polycrystalline silicon in a quartz crucible, dipping a seed crystal into the surface of the melt, a necking process for growing an elongated crystal by pulling the seed crystal, and a shouldering process for growing the crystal in the radial direction to make the crystal have a target diameter. Subsequently, the silicon single crystal ingot having a predetermined diameter is subjected to a body growing process for growing the ingot to a desired length and then a tailing process for gradually reducing the diameter of the silicon single crystal ingot to separate the ingot from the silicon melt to complete the growth of the silicon single crystal ingot.

Upon the growth of the silicon single crystal by the CZ method, vacancies and interstitial silicon are introduced into the single crystal through a solid-liquid interface at which the crystal is formed.

When concentrations of the vacancies and interstitial silicon introduced into the single crystal reach a supersaturated state, the vacancies and interstitial silicon diffuse and aggregate to form vacancy defects (hereinafter, referred to as V defects) and interstitial defects (hereinafter, referred to as I defects). Since these V defects and I defects adversely affect properties of the wafer, the formation of V defects and I defects should be inhibited upon the growth of the silicon single crystal ingot.

In order to inhibit the formation of V defects and I defects, a method of controlling V/G, which is the ratio of a pulling speed V of the single crystal to a temperature gradient G at the solid-liquid interface, in a specific range is generally used, and the G of parameters included in the V/G is controlled through a hot-zone design of a single crystal growing apparatus.

Particularly, the G is generally controlled by changing the structure of an upper heat shielding body which is a hot-zone structure to adjust a melt-gap between the silicon melt and the upper heat shielding body. Herein, the upper heat shielding body refers to a heat shielding member which prevents radiant heat generated from the surface of the single crystal from being released to the outside in order to reduce temperature deviations between the surface and the central portion of the single crystal during the pulling of the silicon single crystal. That is, the melt-gap determined to minimize the temperature gradient difference between the central portion and the surface of the single crystal.

However, as the diameters of silicon single crystals ingot become larger recently, it is increasingly difficult to control the V/G within a defect-free margin. Particularly, controlling the G value only using the upper heat shielding body increases the consumption of the silicon melt during the pulling of the single crystal with the increase in the diameter of the silicon single crystal, so that there has been a limitation in that fluctuation in the melt-gap increases as much as that.

Therefore, it has been difficult to control the G value only using a structural change of the upper heat shielding body to maintain the V/G within a defect-free margin.

Moreover, after the ingot passes through the upper heat shielding body, the ingot grows in a water-cooled tube, and the water-cooled tube rapidly cools the ingot, so that it is difficult to control the cooling rate of the ingot in a temperature zone following the upper heat shielding body. Accordingly, the outer portion of the ingot rapidly cools due to the water-cooled tube, thereby causing an increase in the temperature difference between the central portion and the surface of the ingot and thus making it difficult to control the G value.

Furthermore, in a cooling temperature zone following the formation of V defects and I defects, defects such as oxygen precipitate nuclei are formed upon the cooling of the ingot, and it is thus required to control the cooling rate of the ingot even in the temperature zone. Particularly, as the diameters of wafers become larger than 300 mm recently, deviations of the cooling rate between the central portion C and the outer portion E of the ingot become even larger. Subsequently, machining wafers produced from the ingot leads to various crystal defects in the surfaces of the wafers, i.e., greater differences in concentrations of bulk micro defects (BMD) and oxygen between the central portion and the outer portion of the wafer.

DISCLOSURE OF THE INVENTION

Technical Problem

The present disclosure provides an ingot growing apparatus for producing high quality ingots, the apparatus including a cooling rate control unit which is capable of reducing a difference in the cooling rate between the outer portion and the inner portion of the growing ingot.

Technical Solution

Embodiments provide an apparatus for growing an ingot from silicon melt contained in a crucible by using a seed crystal, the apparatus comprising a chamber including a lower portion for accommodating the crucible and an upper portion through which the growing ingot passes, and a cooling rate control unit which is disposed at the upper portion of the chamber to extend to the lower portion of the chamber and has a hole through which the growing ingot passes, wherein the cooling rate control unit comprises an insulation part for insulating the outer portion of the ingot, a cooling part disposed over the insulation part to cool the ingot, and a blocking part disposed between the insulation part and the cooling part to prevent heat exchange therebetween.

Advantageous Effects

According to the embodiments, the cooling rate of the ingot may be controlled in a certain temperature zone where the ingot cools during the growth of the ingot.

Furthermore, quality of produced wafers may be improved by reducing the difference in the cooling rate between the outer portion E and the central portion C of the ingot.

Particularly, according to the embodiments, there is advantages in that the amount of oxygen precipitate nuclei may be homogeneous throughout the outer portion and the central portion of the ingot, and V defects and I defects may be inhibited by controlling a temperature gradient G.

MODE FOR CARRYING OUT THE INVENTION

Reference will now be made in detail to the embodiments of the present disclosure, examples of which are illustrated in the accompanying drawings. However, the scope of the inventive concept of the embodiments may be determined from the details disclosed by the embodiments, which may include modification of implementation such as addition, deletion, and change of components or parts for the proposed embodiments.

Figure 1:
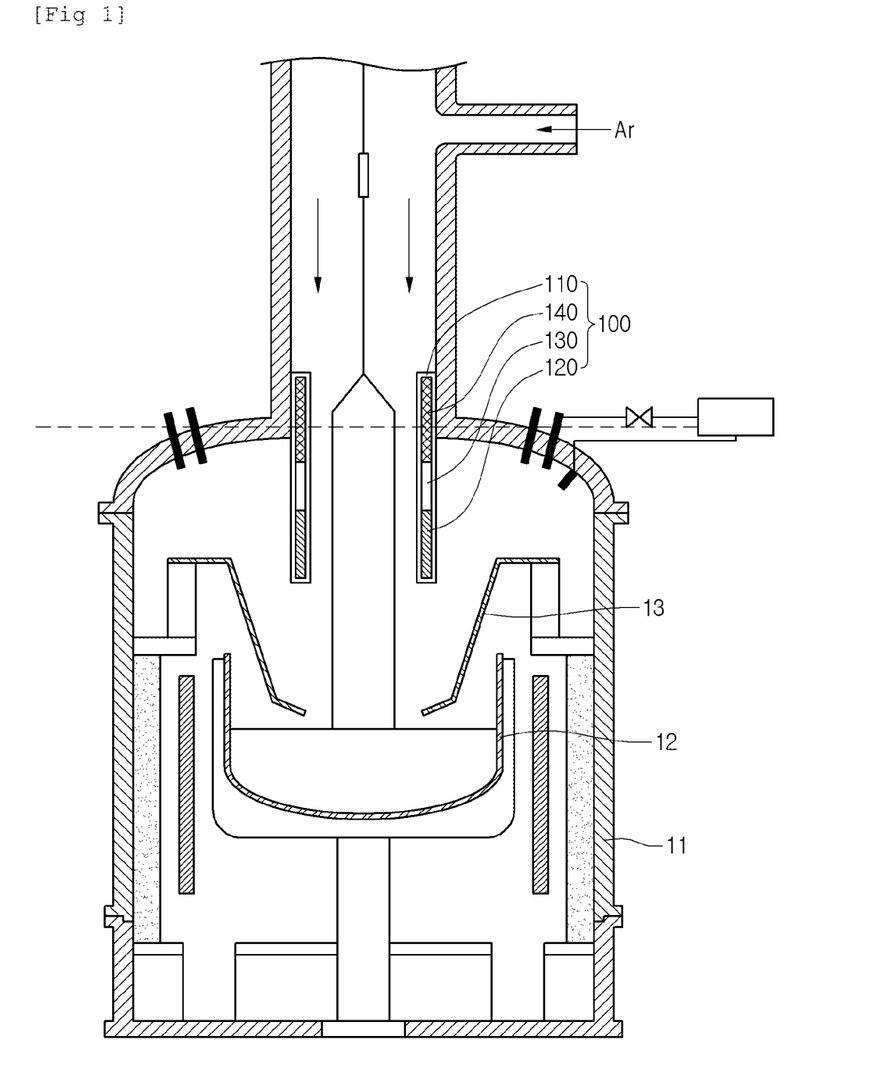
FIG. 1 is a schematic sectional view of an ingot growing apparatus according to an embodiment.

FIG. 1 is a schematic sectional view of an ingot growing apparatus according to an embodiment.

Referring to FIG. 1, the ingot growing apparatus according to an embodiment includes a crucible 12 containing silicon melt, a heater for heating the crucible 12, an upper heat shielding body 13 disposed over the crucible 12 to shield heat of the silicon melt, and a cooling rate control unit 100 for controlling the cooling of an ingot after the ingot passes through the upper heat shielding body 13.

The cooling rate control unit 100 is to control a cooling temperature of the ingot even after the upper heat shielding body 13 controls heat in a hot zone (H/Z) of the ingot. Although later described in detail, the cooling rate control unit 100 controls the cooling rate of the ingot even in a low temperature zone (which refers to a temperature zone where the ingot placed over the upper heat shielding body 13 cools), and particularly, is to reduce the difference in the cooling rate between the outer portion and the inner portion of a larger sized ingot.

For example, while the ingot grown from silicon melt at about 1,500° C., is passing through the upper heat shielding body 13 and growing, the temperature thereof is lowered to about 1,000° C. Then, the ingot grown at 1,000° C. or less passes through the inside of the cooling rate control unit 100 of the embodiment, and from this point, the cooling temperature of the ingot is controlled by the cooling rate control unit 100.

That is, when the ingot cools from 1,500° C. to 1,000° C., vacancy-type and interstitial-type point defects and agglomerated defects formed by agglomeration of the point defects are mainly generated, which are controlled by the upper heat shielding body 13. When the ingot cools at 1,000° C. or less, defects such as oxygen precipitate nuclei formed by combining of oxygen precipitates are mainly generated, which are controlled by the cooling rate control unit 100.

The cooling rate control unit 100 is provided in a chamber 11, in a ring shape including a hole having such a size that allows the growing ingot to pass therethrough, and is disposed at a predetermined distance from the upper heat shielding body 13.

Furthermore, the cooling rate control unit 100 includes a frame part 110 forming an outer framework thereof, an insulation part 120 for insulating the outer portion E of the growing ingot, a cooling part 140 disposed over the insulation part 120 to cool the growing ingot, a blocking part 130 disposed between the insulation part 120 and the cooling part 140 to prevent heat exchange between the cooling part 140 and the insulation part 120.

By the way, heights and lengths of the components constituting the cooling rate control unit 100 are determined according to temperature zones where the ingot cools. The cooling temperature zones are divided according to the type of defect formed during the cooling of the ingot in each temperature zone, it will be thus described on this feature with reference to FIG. 2.

Figure 2:
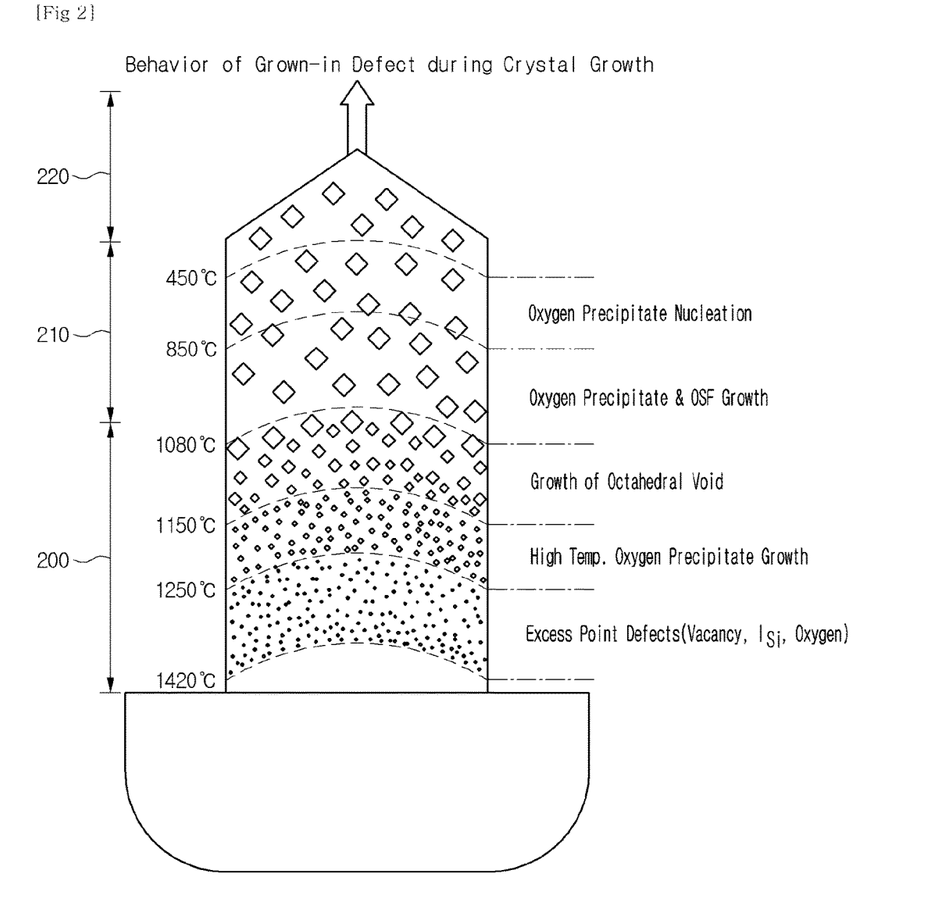
FIG. 2 illustrates an example for describing defects formed according to cooling temperature zones during the growth of an ingot in an ingot growing apparatus.

FIG. 2 illustrates an example for describing the types of defects formed according to cooling temperature zones where an ingot cools.

Referring to FIG. 2, a temperature zone in the range of 1,500 to 1,080° C. where the ingot is pulled from silicon melt and cooled is defined as a first temperature zone 200, a temperature zone in the range of 1,080° to 450° C. where the ingot is subsequently pulled and cooled is defined as a second temperature zone 210, and a temperature zone in the range of 450° C. or less is defined as a third temperature zone 220.

First, in the first temperature zone 200, vacancy-type and interstitial-type point defects are mainly generated.

As described above, defects in the first temperature zone 200 may be controlled by using the V/G value, and the G value may be controlled by the design of the upper heat shielding body 13.

However, when the diameter of the ingot is at least 300 mm, it is difficult to control the G value only using the upper heat shielding body 13. That is, as the diameter of the ingot increases, the consumption of the silicon melt increases during the pulling of the ingot, which increases the melt-gap between bottom of the the upper heat shielding body 13 and the silicon melt surface, and the change in the melt-gap causes a variation of the G value at the solid-liquid interface of the silicon melt. In this case, even if the pulling speed V of the ingot is controlled to be a defect-free pulling speed, the V/G value departs from a defect-free margin in some areas or the entire area of the solid-liquid interface of the silicon melt, and V defects or I defects may thus be formed in the single crystal.

Subsequently, in the second temperature zone 210, oxygen precipitates are formed and grown, and the precipitates are combined to mainly form oxygen precipitate nuclei.

Particularly, between 1,080° C. and 850° C., oxygen precipitates are mainly formed and grown, and between 850° C. and 450° C., these oxygen precipitates agglomerate to mainly form oxygen precipitate nuclei.

These agglomerated oxygen precipitate nuclei are measured as defects such as BMD in wafers.

The oxygen precipitate nuclei may harmfully act as defects in active areas of the wafer to damage an integrated circuit device manufactured with the wafer, but may beneficially function as a gettering site of a metal when present outside of the active area.

Therefore, it is helpful to maintain the BMD to be a certain value for the production of high quality wafers, and it is thus required to control the BMD value during the production of the ingot.

Finally, in the third temperature zone 220, the silicon ingot crystal is completely formed, and the formation of the defects is drastically reduced.

The cooling rate control unit 100 mainly controls the cooling temperature of the ingot in the second temperature zone 210 to control the BMD value of wafers, which is to increase the yield of the ingot by rapidly cooling the ingot in the third temperature zone 220 where the defects are less formed.

Therefore, in the case where the temperature of the growing ingot falls within the second and third temperature zones 210 and 220, the cooling rate of the ingot is controlled by the cooling rate control unit 100 of the embodiment.

However, defects controlled by the cooling rate control unit 100 are not limited to the oxygen precipitate nuclei, but it is obvious that other defects may also be controlled as the cooling rate of the ingot is controlled.

For example, as described in the first temperature zone 200, it becomes difficult to control the G value only using the upper heat shielding body 13 as the diameters of ingots become larger. Therefore, in order to prevent an increase in likelihood to form V defects or I defects, the cooling rate control unit 100 extends to the first temperature zone 200 to control the G value, thereby being capable of preventing the formation of V defects or I defects.

The configuration of the cooling rate control unit 100 will be described in more detail with reference to FIGS. 3 and 4.

Figure 3:
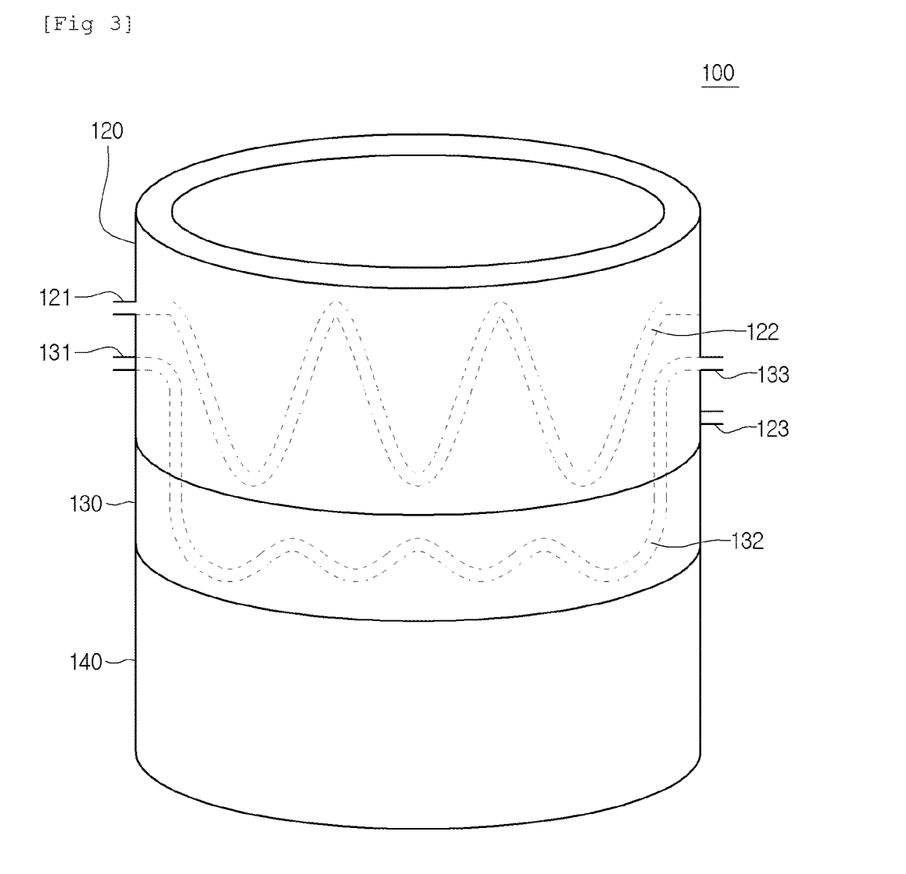
FIG. 3 is a perspective view of a cooling rate control unit according to an embodiment.
Figure 4:
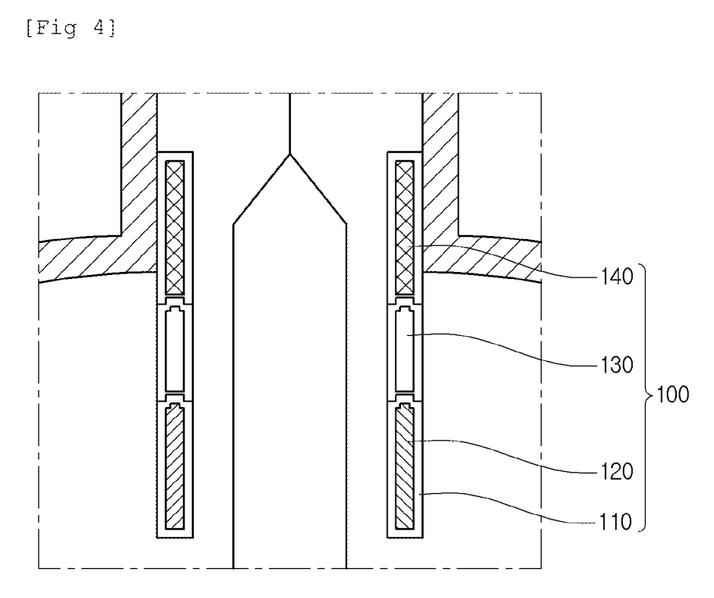
FIG. 4 is a sectional view of a cooling rate control unit according to an embodiment.

FIG. 3 is a perspective view illustrating the internal structure of the cooling rate control unit 100 according to an embodiment, and FIG. 4 is a sectional view illustrating the structure of the cooling rate control unit 100 according to an embodiment.

Referring to FIGS. 3 and 4, the cooling rate control unit 100 is formed in the shape of a cylindrical column of which the interior is provided with a hole through which the ingot is grown.

Furthermore, appearance of the cooling rate control unit 100 is formed according to the frame part 110, the frame part 110 includes inner and outer walls, the inner and outer walls of the frame part 110 are formed at a predetermined distance, with the insulation part 120 and the cooling part 140 disposed therebetween. That is, the width between the inner and outer walls forming the frame part 110 is formed of an empty space.

Furthermore, the empty space of the frame part 110 may include a partition in a horizontal plane thereof so as to divide the empty space into sections in a vertical direction. That is, the internal space of the frame part 110 may be divided into two or more sections by accommodating the partition, and internal divisions of the frame may be respectively formed of the insulation part 120, the blocking part 130, and the cooling part 140.

Also, the frame part 110 may include an opening (not shown) in the side thereof, and the opening may include a window. The opening serves to transmit light so that the growing ingot may be observed through a view port formed in the dome chamber 11.

Also, the frame part 110 may be made of molybdenum, stainless steel, graphite, a carbon composite material, or the like.

Alternatively, the frame part 110 may also be made of different materials for each divided section. For example, a portion of the frame part 110, which corresponds to the insulation part 120, may be made of graphite so as to improve insulation efficiency, and the inner wall surface thereof may be coated with a reflective material such as pyrolytic graphite so as to reflect the heat of single crystal. Also, a portion of the frame part 110, which corresponds to the cooling part 140, may be made of a stainless steel having a high thermal conductivity, and the inner wall surface thereof may be coated with a heat absorbing material.

Moreover, in the case where the divided sections are respectively made of different materials, the cooling rate control unit 100 may be configured in such a way that the cooling part 140 and the insulation part 120 each is manufactured and then detachably assembled. For example, each of the ends of the cooling part 140 and the insulation part 120 may have a male thread, and both ends of the blocking part 130 may have female threads, so that the cooling part and the insulation part may be coupled to the both ends of the blocking part to form the cooling rate control unit 100.

Alternatively, the cooling rate control unit may be configured in such a way that the upper portion of the insulation part 120 and the lower portion of the blocking part 130 are insertedly fitted, and the upper portion of the blocking part 130 and the lower portion of the cooling part 140 are insertedly fitted.

Furthermore, the upper portion of the frame part 110 is connected to the upper portion of the chamber 11, and the lower portion of the frame (110) extends to the upper heat shielding body 13 in a vertical direction.

For example, in order to control the cooling temperature of the ingot from the second temperature zone 210, an end of the frame part 110 extends to a height at which the temperature of the ingot being pulled is in the range of 1,080 to 850° C. Alternatively, in order to control the cooling rate of the ingot to the first temperature zone 200, the end of the frame part 110 may also extend to the top surface of the upper heat shielding body 13.

As described above, the lower portion of the divided frame part 110 is filled with an insulator to form the insulation part 120.

The insulator may be made of carbon felt so as to prevent the silicon melt from being contaminated.

Figure 5:
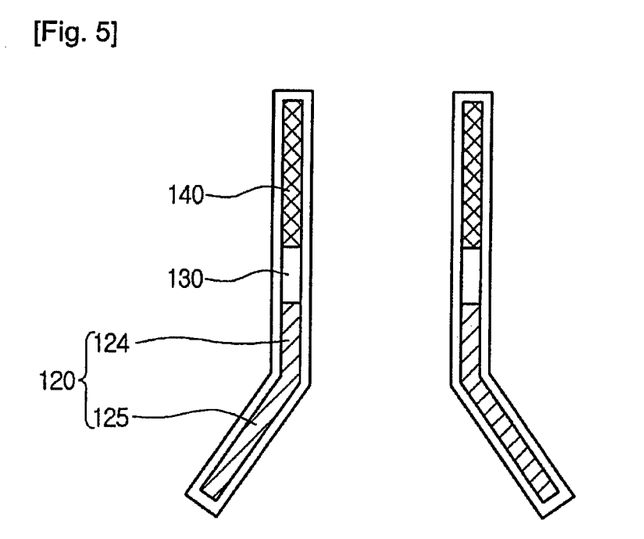
FIG. 5 is a sectional view of a cooling rate control unit according to another embodiment.

Furthermore, the insulation part 120 is to reduce deviations of the cooling rate between the central portion C and the outer portion E of the ingot by insulating the outer portion E during the cooling of the ingot (see FIG. 5).

That is, during the cooling of the ingot, while heat in the central portion C of the ingot is released only by conduction, heat in the outer portion E is released by radiation as well as conduction, so that heat is released in different ways. Furthermore, temperatures of the ambient to which heat is released are also different, and the outer portion E thus relatively more rapidly cools than the central portion C. Thus, the cooling rates in the central portion C and the outer portion E of the ingot are different from each other, thereby causing deviations in each cooling history. Wafers produced from the ingot have inhomogeneous crystal defects in the surfaces thereof, so that the insulation part 120 is to prevent the inhomogeneity.

For example, the BMD value is determined depending on cooling history of the ingot in the second temperature zone 210. If the cooling rates of the outer portion E and the inner portion of the ingot are different from each other, then the BMD values at the outer portion E and the inner portion in a horizontal plane of the ingot are different from each other, thereby causing inhomogeneous BMD values in the surfaces of the wafers manufactured by horizontally slicing the ingot.

Therefore, the insulation part 120 is formed in the lower portion of the cooling rate control unit 100 and the insulation part 120 thus allows the outer portion E of the ingot to be slowly cooled, thereby being capable of reducing deviations of the cooling rate between the central portion C and the outer portion E of the ingot By the way, the greater length of the insulation part 120 reduces deviations of the cooling rate between the outer portion E and the central portion C of the ingot, so that wafers having more homogeneous surface quality may be produced. However, the greater length of the insulation part 120 may also reduce the cooling rate of the ingot, thereby resulting in a shortcoming such as a reduction in production yields of the ingot. Therefore, it is preferable that the insulation part 120 is formed only in a section where defects to be controlled are mainly formed.

For example, the lower portion of the insulation part 120 may be formed at a height at which the temperature at the outer portion E of the ingot is in the range of 1,080 to 800° C., and the upper portion thereof may be formed up to a height at which the temperature at the outer portion E of the ingot is in the range of 450 to 400° C. Particularly, in order to control the concentration of oxygen precipitate nuclei which critically affect the BMD value to be controlled by the insulation part 120, it is preferable in terms of yields of the ingot that the insulation part 120 is formed in a temperature zone in the range of 850 to 450° C. where the oxygen precipitate nuclei are mostly formed.

Alternatively, the lower portion of the insulation part 120 may also be formed up to the height of the top surface of the upper heat shielding body. In this case, the insulation part 120 may advantageously control V defects and I defects by controlling the G value of the ingot after the ingot passes the upper heat shielding body.

In order to rapidly cool the ingot from a height at which the formation of defects in the ingot is drastically reduced, the cooling part 140 is provided in the upper portion of the frame part 110. For example, the cooling part 140 may be formed from a height at which the temperature of the outer portion E of the ingot is between 450° C. and 400° C. because the formation of oxygen precipitate nuclei is drastically reduced at 450° C. or less.

In an embodiment, the cooling part 140 may include a water-cooled tube 122, an inlet 121 for injecting cooling water into the water-cooled tube 122, and an outlet 123 for discharging the cooling water.

That is, the water-cooled tube 122 may be formed of two or more passages. Furthermore, the inlet 121 for introducing cooling water may be formed in one side of the upper portion of the water-cooled tube 122, and the outlet 123 for discharging the cooling water may be formed in one side of the lower portion of the water-cooled tube 122.

Furthermore, a supply pipe for supplying cooling water and a pump (not shown) may be respectively connected to the inlet 121 and the outlet 123 to maintain the cooling water at a low temperature through introducing and discharging of the cooling water.

In this case, the water-cooled tube 122 may be made of a material having a high thermal conductivity, such as stainless steel.

Alternatively, the cooling part 140 may be formed just over the insulation part 120. However, the cooling part 140 may reduce insulation efficiency of the insulation part 120 by cooling the insulation part 120, so that a separate blocking part 130 may be formed between the insulation part 120 and the cooling part 140.

That is, the blocking part 130 may be formed between the insulation part 120 and the cooling part 140 to prevent heat exchange between the insulation part 120 under the blocking part 130 and the cooling part 140 over the blocking part 130. It is enough for the blocking part 130 to have a height for preventing heat exchange between the insulation part 120 and the cooling part 140, so that the blocking part 130 may be formed to have a height less than those of the insulation part 120 and the cooling part 140.

For example, the ratio of vertical lengths of the cooling part, the blocking part, and the insulation part may be 2:1:1.

In order to prevent heat exchange between the cooling part 140 and the insulation part 120, the blocking part may be in a vacuum state, but may be formed of a separate insulator or an empty space.

Alternatively, in another embodiment, the insulation part 120 may be filled with a gas.

For example, the insulation part 120 may include a gas inlet 131, a gas transfer tube 132, and a gas outlet 133 132. In this case, the gas inlet 131 may be formed in the cooling part 140 and the gas transfer tube 132 may extend to the cooling part 140 to be connected to the gas inlet 131.

Furthermore, the gas inlet 131 may be connected to a gas supply pipe for supplying an inert gas and a supplying part (not shown).

Using the gas supply pipe and the supplying part, the insulation part 120 may be filled with the inert gas to improve insulation efficiency.

FIG. 5 is a sectional view of a cooling rate control unit according to another embodiment.

The cooling rate control unit 100 of the embodiment is to improve insulation efficiency of the ingot by modifying the shape of the insulation part 120.

The insulation part 120 of the embodiment may include a first insulation part 124 which maintains the size of a hole through which the growing ingot passes, and a second insulation part 125 which linearly increases the hole size.

The frame part 110 covering the first and second insulation parts 124 and 125 is, of course, formed according to the shape of the insulation part 120.

The width of the second insulation part 125 may increase up to the size of the top surface of the crucible 12 containing the silicon melt.

The insulation part 120 has such a shape that heat released from the silicon melt is effectively shielded against the outside, so that the temperature of the inner space of the insulation part 120 may increase and the temperature of the outside may also be lowered.

Figure 6:
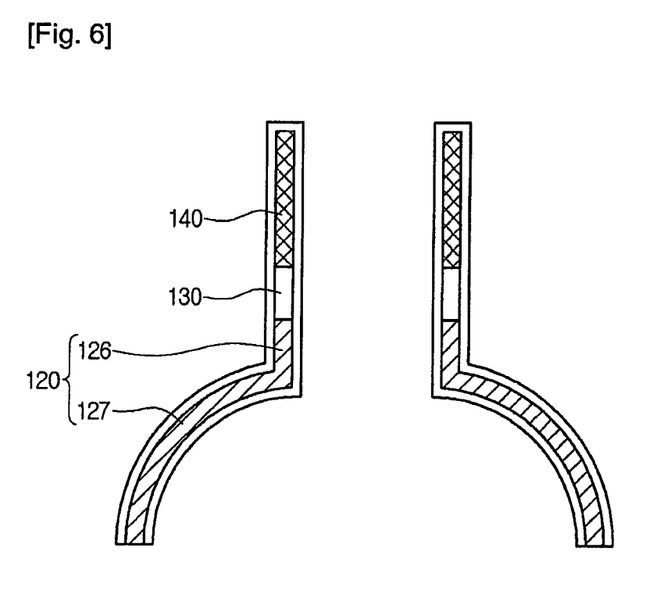
FIG. 6 is a sectional view of a cooling rate control unit according to still another embodiment.

FIG. 6 is a sectional view of a cooling rate control unit according to still another embodiment.

The cooling rate control unit 100 of the embodiment is to improve insulation efficiency of the ingot by modifying the shape of the insulation part 120.

The insulation part 120 of the embodiment may include a first insulation part 126 which maintains the size of a hole through which the growing ingot passes, and a second insulation part 127 which has a dome shape to gradually increase the hole size.

The frame part 110 covering the first and second insulation parts 126 and 127 is, of course, formed according to the shape of the insulation part 120.

The width of the second insulation part 126 may increase up to the size of the top surface of the crucible 12 containing the silicon melt.

The insulation part 120 has such a shape that heat released from the silicon melt is effectively shielded against the outside, so that the temperature of the inner space of the insulation part 120 may increase and the temperature of the outside may also be lowered.

Using the cooling rate control unit 100 according to the aforesaid various embodiments, deviations of the cooling rate between the outer portion E and the central portion C of the ingot in the second temperature zone 210 is reduced due to the insulation part 120 and the ingot passes through the cooling part 140 to be a final production. Hereinafter, changes in the ingot according to the application of the cooling rate control unit 100 will be described.

Figure 7:
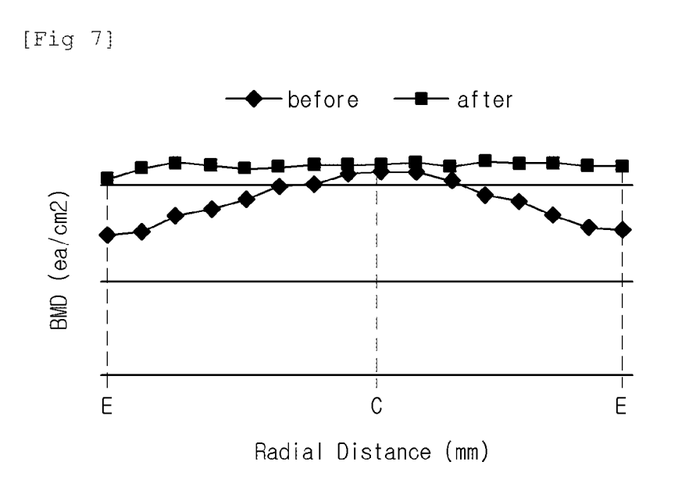
FIG. 7 is graph showing changes in BMD values before and after applying a cooling rate control unit according to an embodiment.

FIG. 7 is graph showing changes in BMD values before and after applying the cooling rate control unit 100 according to an embodiment.

First, before values in the graph are BMD values measured from a wafer produced by slicing a horizontal plane of the ingot grown in an ingot growing apparatus including only a water-cooled tube without the cooling rate control unit 100.

From the graph, it can be seen that the BMD value increases towards the center C from the first outer portion E of the ingot and decreases towards the next outer portion E from the central portion C. That is, it can be seen that the slope of the BMD is large.

The outer portion E of the ingot rapidly cools due to the water-cooled tube, so that time for the formation of oxygen precipitate nuclei is reduced and the BMD value is thus small. On the other hand, the central portion C of the ingot slowly cools compared with the outer portion E, so that time for the formation of oxygen precipitate nuclei increases and the BMD value thus increases.

To the contrary, in the case of BMD values of a wafer produced by slicing a horizontal plane of the ingot grown in the ingot growing apparatus including the cooling rate control unit, it can be confirmed that the BMD values are uniform.

That is, from the graph, it can be confirmed that there is substantially no difference in the BMD value between the outer portion E and the central portion C of the ingot. In other words, it can be confirmed that the slope of the BMD is determined to be closely zero.

The outer portion E of the ingot is insulated by the insulation part 120, so that cooling times in the outer portion E and the central portion C of the ingot are almost the same. Therefore, the outer portion E and the central portion C of the ingot are similar in the BMD value which is proportional to the cooling time.

As described above, using the ingot growing apparatus of the embodiments, deviations of the cooling rate in the outer portion E and the inner portion of the ingot may be reduced by controlling the cooling temperature of the ingot in a zone below the second temperature zone 210. Therefore, the ingot growing apparatus has an advantage in that wafers of uniform quality may be produced from the ingot.

Although the present invention has been described with reference to the embodiments illustrated in the drawings, it should be understood that numerous other modifications and equivalent alternative embodiments can be devised by those skilled in the art.

INDUSTRIAL APPLICABILITY

The present invention relates to an ingot growing apparatus for producing wafers and a cooling apparatus used therein, and is thus industrially applicable.

The invention claimed is:

1. An ingot growing apparatus for growing an ingot from silicon melt contained in a crucible by using a seed crystal, the apparatus comprising:
    a chamber including a lower portion for accommodating the crucible and an upper portion disposed over the lower portion, the ingot being cooled as the ingot vertically moves from the lower portion to the upper portion;
    a heat shielding body disposed over the crucible, the heat shielding body corresponding to a first temperature zone in which the ingot is cooled from 1,414° C. to 1,080° C.;
    an insulation part having a first ring shape and disposed over the heat shielding body to insulate the ingot, the insulation part corresponding to a second temperature zone in which an outer portion of the ingot is cooled from 800° C. to 450° C.;
    a first frame part surrounding the insulation part;
    a cooling part having a third ring shape corresponding to the first ring shape and disposed on the insulation part to cool the ingot, the cooling part corresponding to a third temperature zone in which the outer portion of the ingot is cooled from 450° C. to 400° C.;
    a third frame part surrounding the cooling part and connected to the upper portion of the chamber;
    a blocking part having a second ring shape corresponding to each of the first and third ring shapes and disposed between the insulation part and the cooling part to prevent heat exchange therebetween; and
    a second frame part surrounding the blocking part and downwardly inserted into the first frame part and upwardly inserted into the third frame part,
    wherein the first frame part, the second frame part and the third frame part are made of different materials, the first frame part being made of graphite, an inner wall surface of the first frame part being coated with a reflective material, the third frame part being made of stainless steel, and an inner wall surface of the third frame part being coated with a heat absorbing material.

2. The ingot growing apparatus of claim 1, wherein the insulation part is made of an insulator of carbon felt.

3. The ingot growing apparatus of claim 1, wherein the blocking part is in a vacuum state between the insulation part and the cooling part.

4. The ingot growing apparatus of claim 1, wherein the cooling part comprises a water-cooled tube for cooling the ingot along the inner wall of the upper portion of the chamber.

5. The ingot growing apparatus of claim 1, wherein the heat shielding body having a hole through which the growing ingot passes, as an insulating unit disposed over the crucible,
    wherein the insulation part extends to the toward a top surface of the heat shielding body.

6. The ingot growing apparatus of claim 1, wherein the ratio of vertical lengths of the cooling part, the blocking part, and the insulation part is 2:1:1.

7. The ingot growing apparatus of claim 1, wherein the cooling part comprises a water-cooled tube, an inlet for injecting cooling water into the water-cooled tube, and an outlet for discharging the cooling water.

8. The ingot growing apparatus of claim 1, wherein the insulation part comprises a gas inlet, a gas transfer tube, and a gas outlet.

9. The ingot growing apparatus of claim 1, wherein the insulation part is formed such that a size of a hole through which the ingot passes gradually increases.

10. The ingot growing apparatus of claim 9, wherein the insulation part has a dome shape to gradually increase the size of the hole.

\* \* \* \* \*